United States Patent
Shim (10) Patent No.: US 6,570,201 B2
(45) Date of Patent: May 27, 2003

(54) CMOS IMAGE SENSOR CAPABLE OF INCREASING PUNCH-THROUGH VOLTAGE AND CHARGE INTEGRATION OF PHOTODIODE

(75) Inventor: Jin-Seop Shim, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 09/973,946

(22) Filed: Oct. 11, 2001

(65) Prior Publication Data

US 2002/0175355 A1 Nov. 28, 2002

(30) Foreign Application Priority Data

May 22, 2001 (KR) ........................ 2001-27923

(51) Int. Cl.[7] ..................... H01L 31/062; H01L 31/113; H01L 31/06
(52) U.S. Cl. .......................... 257/292; 257/462
(58) Field of Search ................. 257/292, 345, 257/339, 462, 461

(56) References Cited

U.S. PATENT DOCUMENTS 5,698,874 A * 12/1997 Hayashi ...................... 257/232
5,766,998 A * 6/1998 Tseng .......................... 438/291
5,872,371 A * 2/1999 Guidash et al. ............. 438/279
5,972,764 A * 10/1999 Huang et al. ................ 257/223

FOREIGN PATENT DOCUMENTS

JP 2001015727 A * 1/2001 ......... H01L/27/146

OTHER PUBLICATIONS

Inoue et al., New LV–BPD (Low Voltage Buried Photo-Diode) for CMOS Imager, 1999, IEDM 99–883–886.

* cited by examiner

Primary Examiner—Tom Thomas
Assistant Examiner—Samuel A Gebremariam
(74) Attorney, Agent, or Firm—Jacobson Holman PLLC (57) ABSTRACT

A CMOS image sensor capable of increasing the punch-through voltage and the charge integration of a photodiode, and a method for forming the same. The punch-through voltage of a transfer transistor is increased, and the potential barrier is heightened between the photodiode and the floating diffusion region during the turn-off of the transfer transistor so as to increase the charge accumulation amount of the photodiode, while the photodiode is formed without resorting to a self-aligned ion-implantation. A p-type impurity region is formed under the gate electrode of the transfer transistor and within the semiconductor substrate, and the process can proceed without being limited by the self-alignment. Further, the p-type impurity region heightens the potential barrier between the photodiode and the floating diffusion region, i.e., the potential difference between the two regions is increased and, therefore, the charge accumulation amount is increased in the photodiode.

2 Claims, 7 Drawing Sheets

CM OS IMAGE SENSOR CAPABLE OF INCREASING PUNCH-THROUGH VOLTAGE AND CHARGE INTEGRATION OF PHOTODIODE

FIELD OF THE INVENTION

The present invention relates to a method for fabricating a CMOS image sensor. Particularly, the present invention relates to a CMOS image sensor capable of increasing the punch-through voltage and the charge integration of a photodiode, and a method for forming the same.

BACKGROUND OF THE INVENTION

The CMOS image sensor is a device for converting optical images to electrical signals. That is, it responds to the visible light, and the signal electrons thus formed are converted to voltages. Then the voltages are subjected to a signal processing to reconvert the voltages to image information.

Used for recalling images, the CMOS image sensor is widely applied to cameras, medical equipment, monitoring devices, various industrial apparatuses for locating and sensing, toys, and the like. Such devices are driven with a low voltage, and a single chip is sufficient in most cases. Accordingly, the field of application for these sensors is being gradually expanded.

In the CMOS image sensor, there are formed as many MOS transistors as the number of pixels, and a switching method is adopted in which the outputs are checked one by one.

In the CMOS image sensor, compared with the conventionally and widely used CCD image sensor, the driving method is simple, and diversified scanning methods can be realized while the signal processing circuit can be packed into a single chip. Accordingly, not only can the product be miniaturized, but also a high compatibility can be achieved with the result being reduced manufacturing cost and power consumption.

Figure 1:
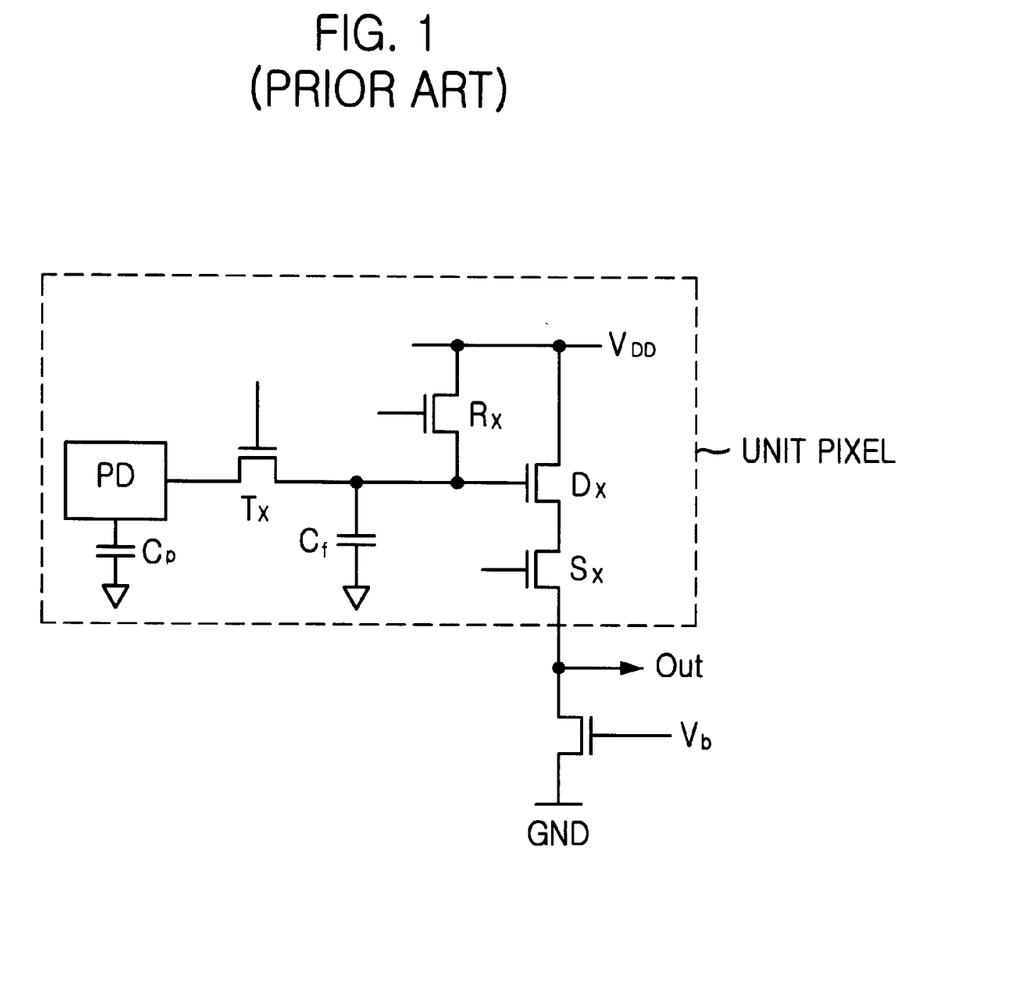
FIG. 1 is a circuit diagram showing the constitution of a unit pixel of a conventional CMOS image sensor.

FIG. 1 is a circuit diagram of a unit pixel of a conventional CMOS image sensor that includes four transistors and two capacitors. That is, there is a photodiode as a photo-sensing means, and four NMOS transistors.

The four NMOS transistors serve the following roles. A transfer transistor Tx carries the photoelectric charges of the photodiode PD to a floating diffusion region. A reset transistor Rx discharges the electric charges from the floating diffusion region so as to make it possible to detect the signals. A drive transistor Dx serves as a source follower, and a select transistor Sx carries out the switching and addressing.

In the drawing, reference code Cf indicates the capacitance of the floating diffusion region, and Cp indicates the capacitance of the photodiode. The image sensor thus constituted operates in the following manner. First, the reset transistor Rx, the transfer transistor Tx and the select transistor Sx are turned on, thereby resetting the unit pixel.

Under this condition, the photodiode PD begins to be depleted, and a carrier-charging occurs in the capacitance Cp, while the capacitance Cf of the floating diffusion region is charge-accumulated up to the supply voltage Vdd. Then the transfer transistor Tx is turned off, and the select transistor Sx remains turned on, while the reset transistor Rx is turned off.

In this operation, an output voltage V1 is read from a unit pixel output terminal (Out) and stored in a buffer. Then the transfer transistor Tx is turned on, and thus, the carriers of the capacitance Cp, which have been affected by the intensities of the visible light, are moved to the capacitance Cf. An output voltage V2 is read from the terminal (Out), and the difference between the two voltages (V1–V2) is converted from an analog data to a digital data, thereby completing an operational cycle of the unit pixel.

Now referring to FIGS. 2A to 2C, the conventional fabrication processes will be described for the transfer transistor, the photodiode and the floating diffusion region of the CMOS image sensor.

Figure 2A:
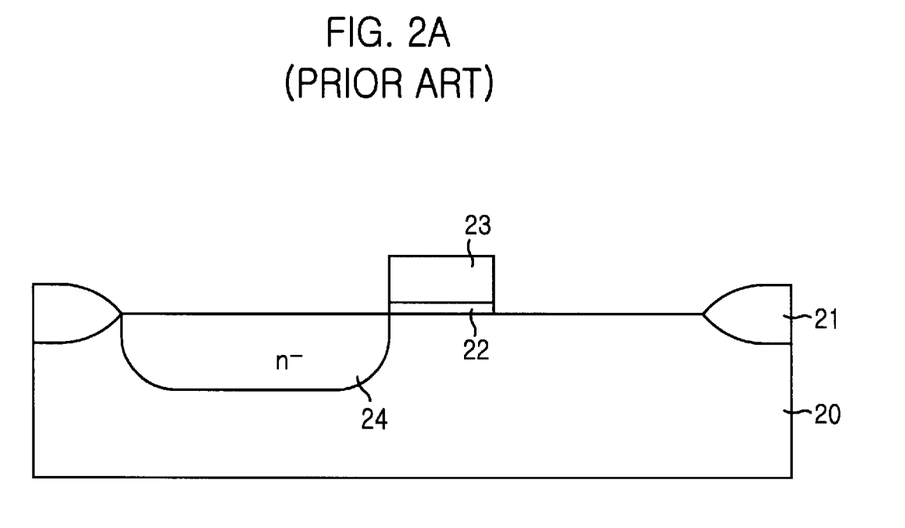
FIGS. 2A to 2C are sectional views showing the fabrication process for a transfer transistor, a photodiode and a floating diffusion region of the conventional image sensor.

First, as shown in FIG. 2A, a gate insulating film 22 and a gate electrode 23 are formed on a p-type semiconductor substrate 20 on which a device isolating film 21 has been formed. Further, at one end of the gate electrode 23 and within the semiconductor substrate 20, there is formed an n type impurity region 24 that will form a photodiode PD.

Figure 2B:
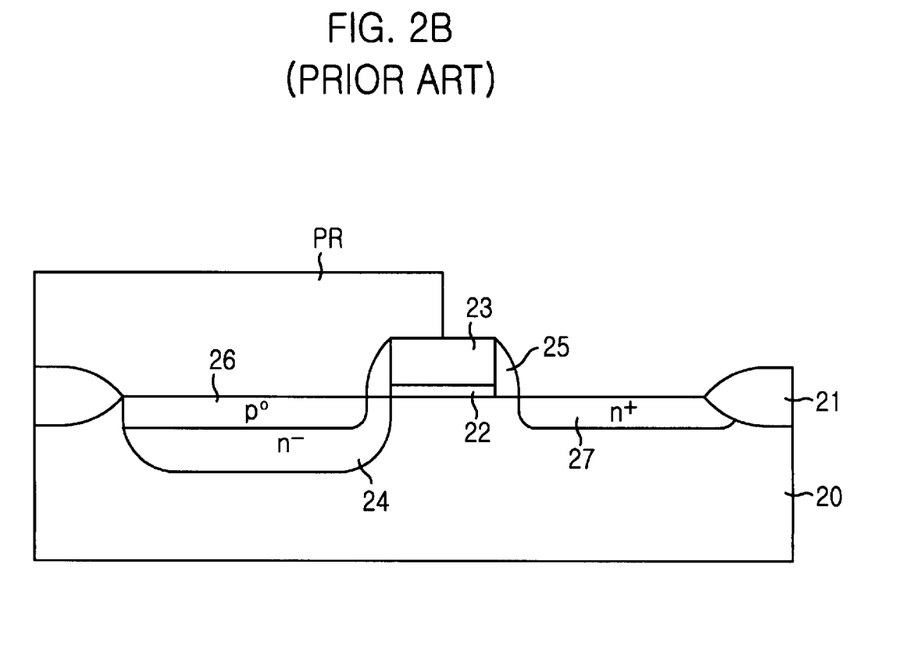
Figure 2C:
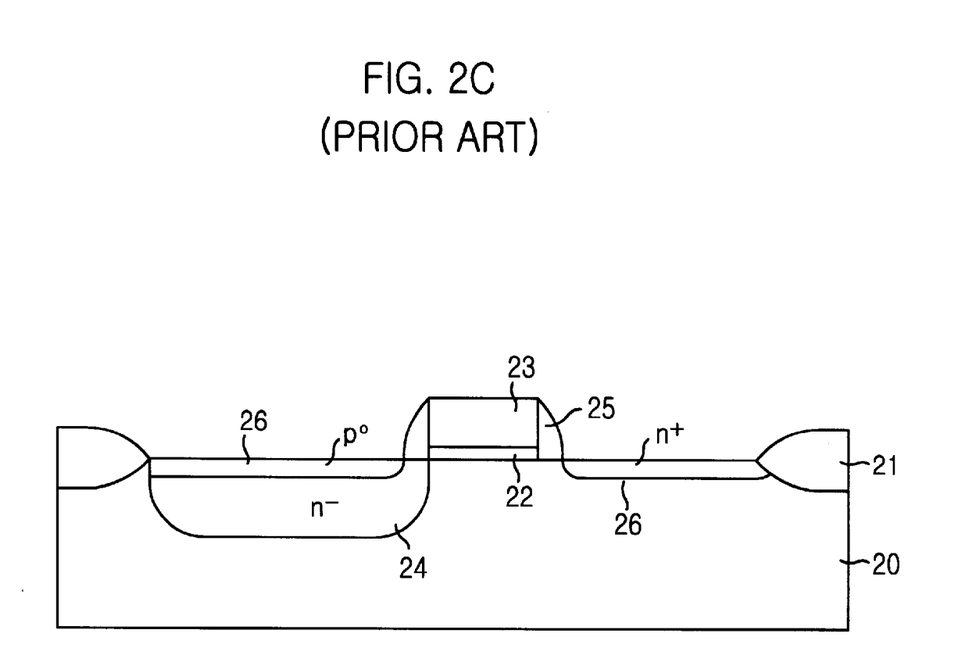

Then as shown in FIG. 2B, an insulating spacer 25 is formed on a side wall of the gate electrode 23, and a p-type impurity region 26 is formed on the n-type impurity region 24, thereby completing the formation of the photodiode.

Thereafter, in order to form a floating diffusion region, a photoresist pattern PR is formed by using an ion-implantation mask, and an n-type dopant is ion-implanted, thereby forming a floating diffusion region 27. Then as shown in FIG. 2C, the photoresist pattern PR is removed.

In the above described conventional CMOS image sensor fabricating process, a self-aligning ion-implantation is carried out to forming n-type impurity region of the photodiode by utilizing the gate electrode 23 having the insulating spacer 25.

Further, the transfer transistor for moving the charges from the photodiode to the floating diffusion region consists of a native NMOS transistor in which the threshold voltage has been adjusted to less than 0 V so as to prevent a voltage drop. The lower portion of the transfer transistor Tx simply consists of a p-type epitaxial layer.

As the size of the chip is reduced, the channel length of the transfer transistor is shortened. Therefore, a punch-through occurs at even a low voltage so as to cause leakage.

Further, when the transfer transistor is turned off, the potential barrier is lowered between the photodiode and the floating diffusion region and, therefore, the charge accumulation amount is decreased in the photodiode during the charge integration. Further, if the self-alignment is not well designed when forming the photodiode region, a process variation may occur.

SUMMARY OF THE INVENTION

The present invention is intended to overcome the above described disadvantages of the conventional technique.

Therefore it is an object of the present invention to provide a CMOS image sensor and a fabricating method therefor, in which the punch-through voltage of a transfer transistor is increased, the potential barrier is heightened between the photodiode and the floating diffusion region during the turn-off of the transfer transistor so as to increase the charge accumulation amount of the photodiode, and the photodiode is formed without resorting to a self-aligning ion-implantation.

In achieving the above object, the CMOS image sensor having a transfer transistor for transferring charges from a photodiode to a floating diffusion region according to the present invention includes a semiconductor substrate; a gate electrode of the transfer transistor, the gate electrode being formed on the semiconductor substrate; a photodiode including a first conduction type first impurity region and a second conduction type second impurity region, the two regions being formed at one end of the gate electrode and within the semiconductor substrate; a floating diffusion region including a second conduction type third impurity region, the third impurity region being formed at another end of the gate electrode and within the semiconductor substrate; and a first conduction type fourth impurity region formed under the gate electrode and within the semiconductor substrate, and isolated from the photodiode and the floating diffusion region.

In another aspect, the present invention includes a method for forming a CMOS image sensor with a transfer transistor included therein for transferring the charges from a photodiode to a floating diffusion region, the method including steps of forming a first conduction type first impurity region in a photodiode-forming region and within a semiconductor substrate; forming a second conduction type second impurity region in a transfer transistor region and within the semiconductor substrate; forming a gate insulating film and a gate electrode of the transfer transistor on the semiconductor substrate, a portion of the gate electrode being overlapped with the second impurity region; forming a second conduction type third impurity region upon the first impurity region and within the semiconductor substrate; and forming a first conduction type floating diffusion region isolated from the photodiode region and across the gate electrode.

In still another aspect, the present invention includes a method for forming a CMOS image sensor with a transfer transistor included therein for transferring the charges from a photodiode to a floating diffusion region, the method including steps of forming a first ion-implantation mask for defining a photodiode-forming region in a semiconductor substrate; forming a first conduction type first impurity region within the semiconductor substrate by carrying out an ion-implantation; removing the first ion-implantation mask; forming a second ion-implantation mask for defining a transfer transistor region on the semiconductor substrate; forming a second conduction type second impurity region within the semiconductor substrate by carrying out an ion-implantation; removing the second ion-implantation mask; forming a gate insulating film and a gate electrode of the transfer transistor on the semiconductor substrate, a portion of the gate electrode being overlapped with the second impurity region; forming a second conduction type third impurity region upon the first impurity region and within the semiconductor substrate; and forming a first conduction type floating diffusion region within the semiconductor substrate, isolated from the photodiode region and across the gate electrode.

In the present invention, the CMOS image sensor is characterized in that a p-type impurity region is formed under the gate electrode of the transfer transistor and within the semiconductor substrate.

Further, in the present invention, the fabricating process can be undertaken without being limited by self-alignment and, therefore, any process variations can be inhibited. That is, in a design in which an n-type impurity region of a photodiode of 200 Kev or more has to be formed down to a deep depth, the channeling effect that is caused by self-alignment can be overcome.

Further, a p-type impurity region is formed under the gate electrode of the transfer transistor and within the semiconductor substrate and, therefore, the potential barrier between the photodiode and the floating diffusion region is heightened. That is, the potential difference between the two regions is increased, with the result being that the charge storing capacity of the photodiode is increased.

BRIEF DESCRIPTION OF THE DRAWINGS

The above objects and other advantages of the present invention will become more apparent by describing in detail preferred embodiments of the present invention with reference to the attached drawings in which.

DETAILED DESCRIPTION OF THE PREFERRED EMBODIMENT

The preferred embodiment of the present invention will be described referring to FIGS. 3A to 3D.

Figure 3A:
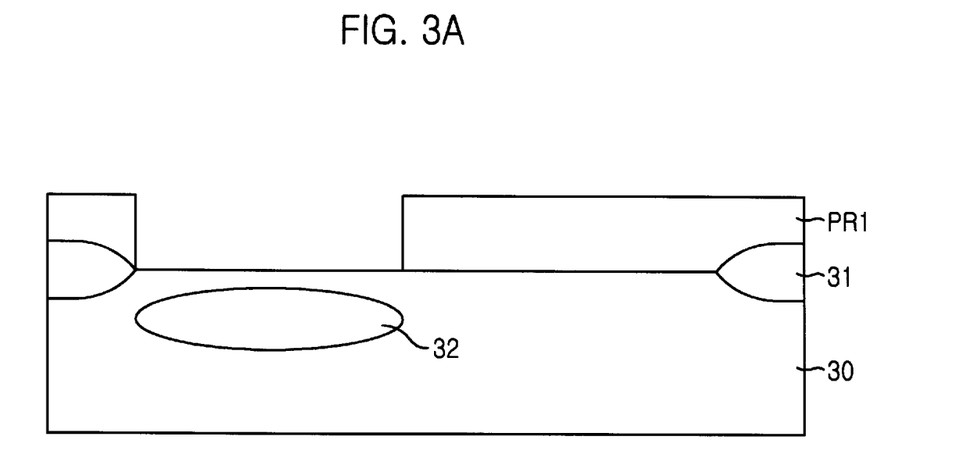
FIGS. 3A to 3D are sectional views showing the fabrication process for a transfer transistor, a photodiode and a floating diffusion region of an image sensor according to the present invention.

First, as shown in FIG. 3A, an ion implantation mask is prepared for defining a photodiode-forming region on a p-type semiconductor substrate 30 on which a device isolating film 31 has been formed. Then by using the mask, a first photoresist pattern PR1 is formed, and then, an ion implantation is carried out to form an n-type impurity region 32 for a photodiode.

Figure 3B:
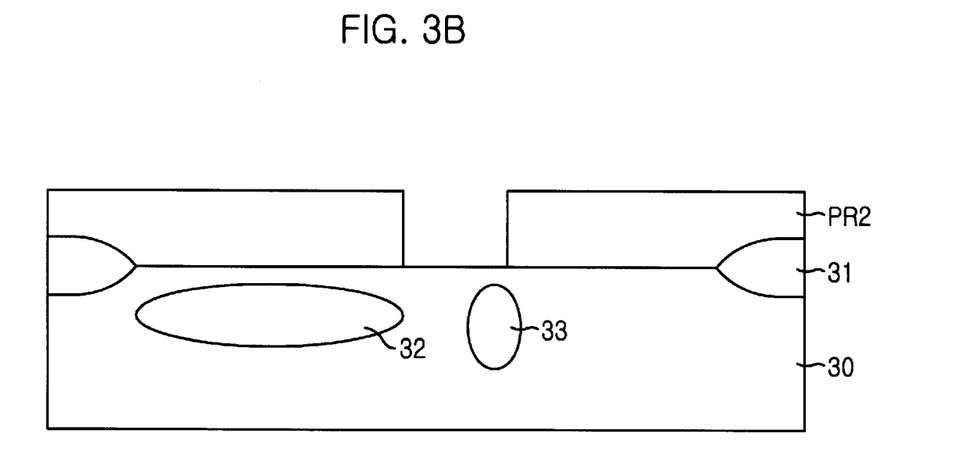

Then the first photoresist pattern PR1 is removed and, as shown in FIG. 3B, a second photoresist pattern PR2 is formed by using an ion implantation mask for defining a transfer transistor region. Then a dopant such as boron (B) or the like is ion-implanted to form a p-type impurity region 33.

Figure 3C:
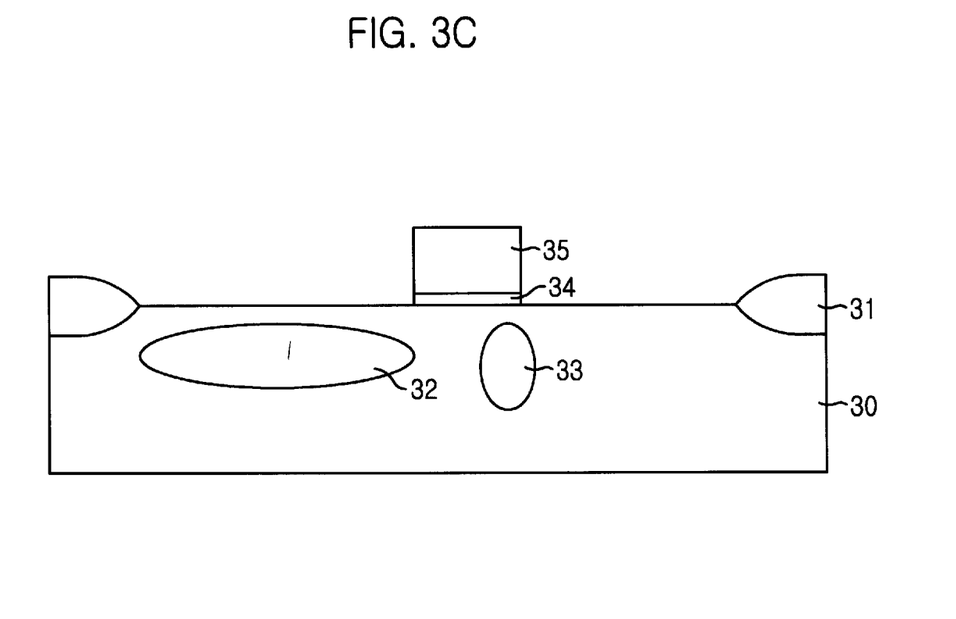

Then as shown in FIG. 3C, a gate insulating film 34 and a gate electrode 35 for the transfer transistor are formed in such a manner that a portion of the gate electrode 35 is overlapped with the p-type impurity region 33.

Figure 3D:
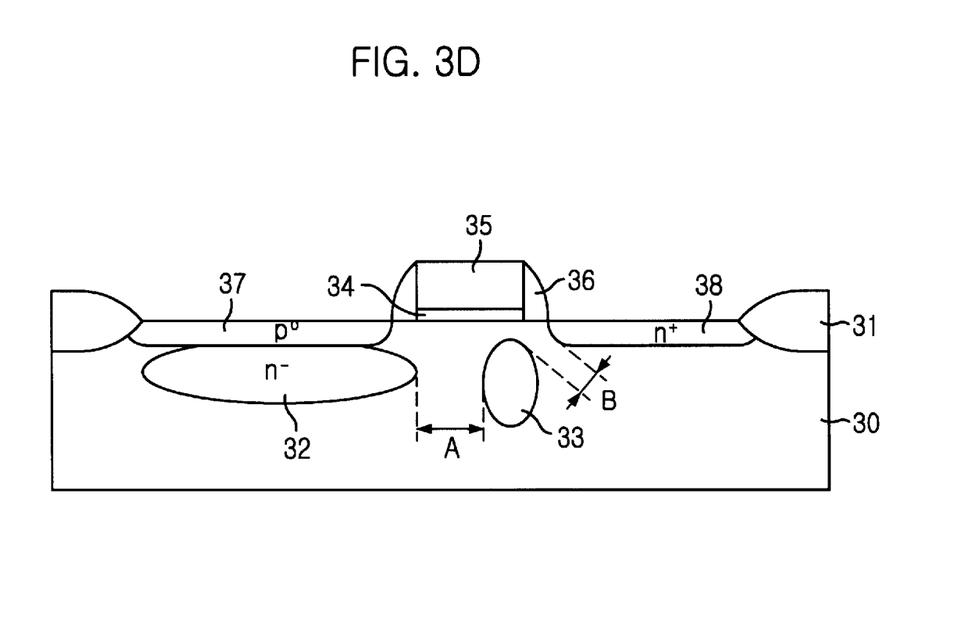

Then as shown in FIG. 3D, post processes for fabricating the CMOS image sensor are carried out. That is, an insulating film spacer 36, a photodiode p-type impurity region 37 and an n+ floating diffusion region 38 are formed.

Meanwhile, when a voltage is supplied to the gate electrode 35 of the transfer transistor, the voltage is adequately supplied to the n type impurity region 32 of the photodiode, which is more deeply formed than the n+ floating diffusion region 38. As a result, the read-out becomes more advantageous.

That is, if the threshold voltage of the transfer transistor is increased due to the p-type impurity region 33, then the transistor cannot serve as a native transistor and, therefore, the above measure is for coping with the problems which may arise during a drop of the operating voltage. However, if the transfer transistor is constituted like a pump circuit, the distance A between the p-type impurity region 33 and the n-type impurity region 32 of the photodiode need not be taken into account.

Meanwhile, the concentration of the n+ floating diffusion region 38 is considerably higher than that of the p-type impurity region 33 and, therefore, the operational characteristics are not much affected by the p-type impurity region 33. Rather, the capacitance of the n+ floating diffusion region 38 is decreased by the formation of the p-type impurity region 33 and, therefore, the conversion ratio increases, with the result being that an improvement in sensitivity can be expected.

In the above described embodiment of the present invention, the distance A between the p-type impurity region 33 and the photodiode is made greater than the distance B between the p-type impurity region 33 and the n+ floating diffusion region 38.

Figure 4A:
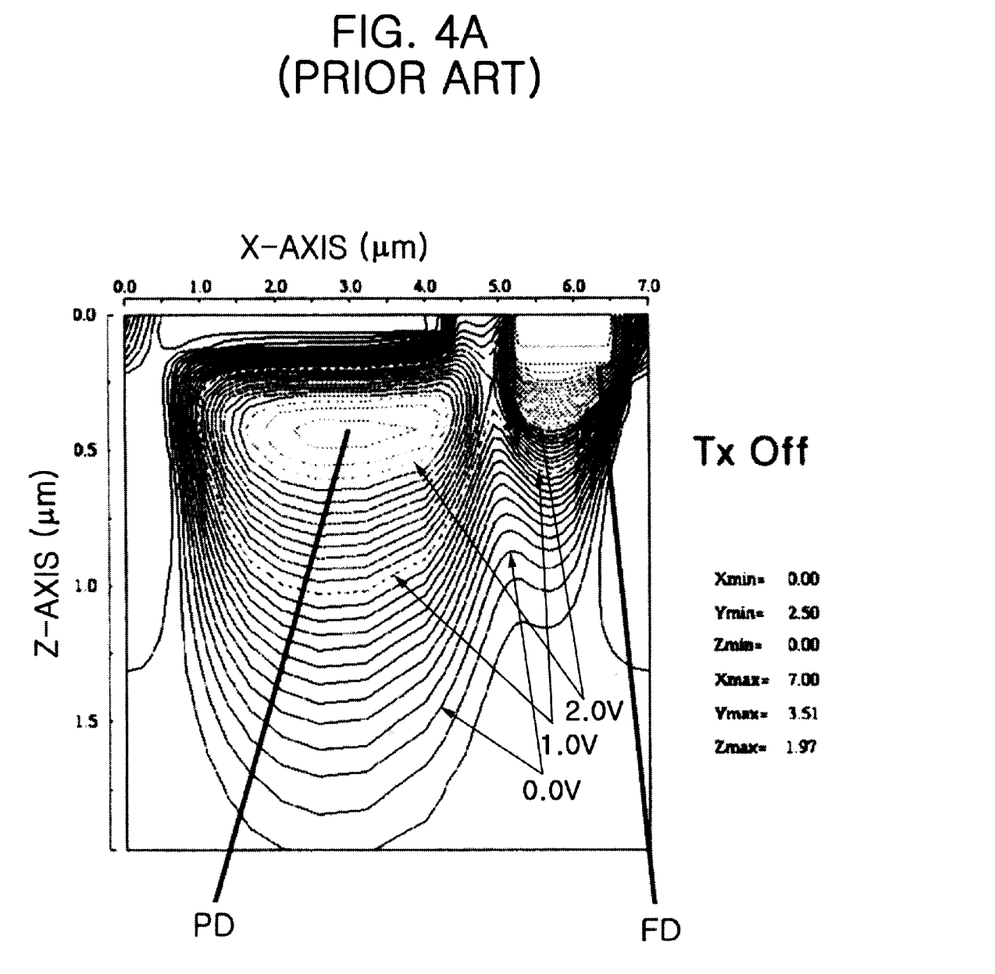
FIG. 4A is a graphical illustration showing the simulation results of the potential changes in the conventional image sensor.
Figure 4B:
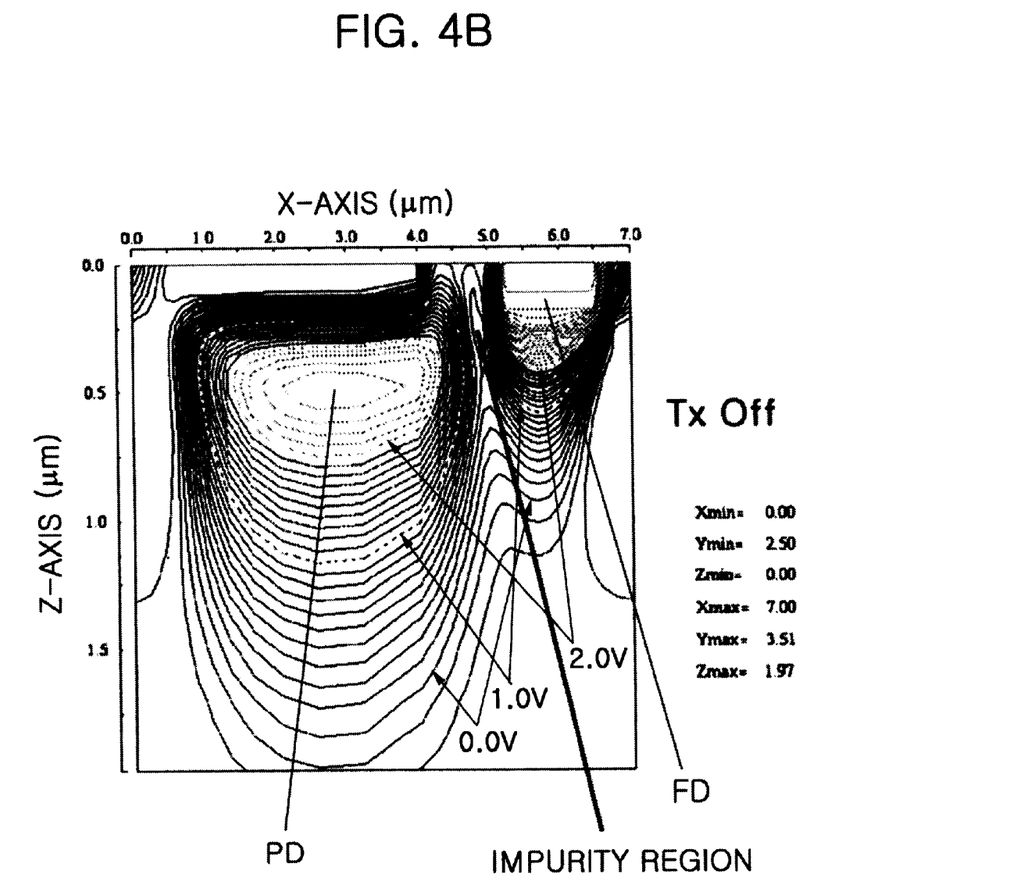
FIG. 4B is a graphical illustration showing the simulation results of the potential changes in the image sensor according to the present invention.

FIG. 4A is a graphical illustration showing the simulation results of the potential changes in the conventional image sensor which may be compared with the image sensor according to the present invention shown in FIG. 4B. In the potential distribution, the potential difference between the lines is 0.1 V.

In the case of the conventional image sensor shown in FIG. 4A, the potential difference between the photodiode PD and the floating diffusion region (FD) is 1.2 V, whereas in the image sensor of the present invention shown in FIG. 4B and having the p-type impurity region, the potential difference between the photodiode and the floating diffusion region is increased to 1.8 V.

As to process variation, at the process tolerance of 0.1 μm for the photodiode region, the conventional image sensor shows a maximum potential barrier of 1.4 V and a minimum potential barrier of 0.9 V, the difference between the two values being 0.5 V. In contrast to this, the image sensor according to the present invention shows a maximum potential barrier of 2.1 V, and a minimum potential barrier of 1.8 V, the difference between the two values being 0.3 V. Thus in the present invention, the maximum and minimum potential barrier values are markedly increased, while the difference between the two values is significantly decreased.

Thus the characteristics of the photodiode according to the present invention are significantly improved compared with those obtained using the conventional self-aligning method. That is, if the self-aligning method is not adopted in forming the n-type impurity region 32 without forming the p-type impurity region 33, then the variation range of the potential barrier is 0.5 V at the process tolerance of 0.1 μm and, therefore, the saturation voltage differences between different pixels become too high, with the result that the overall sensitivity characteristics cannot be regulated.

In contrast to this, in the case where the p-type impurity region 33 is formed as in the present invention, the difference between the maximum and minimum potential barriers is decreased to 0.3 V, and therefore, the process variation is reduced. Accordingly, in the present invention, the punch-through voltage and the saturation voltage can be increased, while maintaining a difference between potential barriers similar to that obtained through the conventional self-aligning method.

According to the present invention as described above, the n-type impurity region can be formed without resorting to the self-aligning method and, therefore, the process variation can be decreased during the ion implantation. That is, when the ion implantation is carried out with an energy of 200 eV or more to form the n-type impurity region in the conventional technique, a channeling problem occurs. The present invention solves this channeling problem by forming the p-type impurity region under the gate electrode of the transfer transistor and within the semiconductor substrate.

Further, the punch-through voltage can be reinforced between the photodiode and the floating diffusion region even when the channel length of the transfer transistor is shortened. Further, the potential barrier between the photodiode and the floating diffusion region is heightened, thereby increasing the charge integrity of the photodiode.

As set forth above, the present invention is described based on a specific preferred embodiment and the attached drawings, but it should be apparent to those of ordinary skilled in the art that various changes and modifications can be made without departing from the spirit and scope of the present invention, which will be defined in the appended claims.

What is claimed is:

1. A CMOS image sensor having a transfer transistor for transferring charges from a photodiode to a floating diffusion region, comprising:

a semiconductor substrate;

a gate electrode of the transfer transistor, the gate electrode being formed on the semiconductor substrate;

a photodiode including a first conduction type first impurity region and a second conduction type second impurity region, the first and second regions being formed at one end of the gate electrode and within the semiconductor substrate;

a floating diffusion region including a second conduction type third impurity region, the third region being formed at another end of the gate electrode and within the semiconductor substrate; and a first conduction type fourth impurity region formed under the gate electrode and within the semiconductor substrate, and spaced apart from the photodiode and the floating diffusion region, wherein a distance between the fourth impurity region and the photodiode is greater than a distance between the fourth impurity region and the floating diffusion region.

2. The CMOS image sensor as claimed in claim 1, wherein the first conduction type is a p-type, and the second conduction type is an n-type.

* * * * *